United States Patent
Tsai et al.

(10) Patent No.: US 7,612,326 B2
(45) Date of Patent: Nov. 3, 2009

(54) ANGLE-CALCULATION APPARATUS AND ANGLE-CALCULATION METHOD FOR THREE-PHASE OPTICAL ENCODER

(75) Inventors: Chin-Shiong Tsai, Taoyuan Shien (TW); Cheng-Ping Lin, Taoyuan Shien (TW); Meng-Chang Lin, Taoyuan Shien (TW); Mi-Tine Tsai, Taoyuan Shien (TW); Po-Ming Chen, Taoyuan Shien (TW)

(73) Assignee: Delta Electronics Inc., Taoyuan (TW)

( * ) Notice: Subject to any disclaimer, the term of this patent is extended or adjusted under 35 U.S.C. 154(b) by 143 days.

(21) Appl. No.: 11/845,234

(22) Filed: Aug. 27, 2007

(65) Prior Publication Data
US 2009/0058349 A1    Mar. 5, 2009

(51) Int. Cl.
*G01D 5/34* (2006.01)
(52) U.S. Cl. .............................. 250/231.13; 250/231.16; 250/231.14
(58) Field of Classification Search ................. 250/231.13–231.18; 356/614–619; 341/13–16; 33/1 N, 1 PT
See application file for complete search history.

(56) References Cited

U.S. PATENT DOCUMENTS

| | | | | |
|---|---|---|---|---|
| 3,675,238 A * | 7/1972 | Butscher | ..................... | 341/159 |
| 4,259,570 A * | 3/1981 | Leonard | .................. | 250/214 A |
| 4,266,125 A * | 5/1981 | Epstein et al. | ......... | 250/231.16 |
| 4,691,101 A * | 9/1987 | Leonard | ................ | 250/231.16 |
| 6,084,234 A * | 7/2000 | Stridsberg | .............. | 250/231.16 |
| 6,172,359 B1 * | 1/2001 | Stridsberg | .............. | 250/231.13 |
| 6,191,415 B1 * | 2/2001 | Stridsberg | .............. | 250/231.13 |
| 6,355,927 B1 * | 3/2002 | Snyder | .................. | 250/231.13 |
| 6,433,536 B1 * | 8/2002 | Yundt et al. | ............ | 324/207.22 |
| 6,512,222 B2 * | 1/2003 | Aoki | ...................... | 250/231.13 |
| 6,630,659 B1 * | 10/2003 | Stridsberg | .............. | 250/231.13 |
| 6,660,997 B2 * | 12/2003 | Laberge et al. | ......... | 250/231.18 |
| 6,906,315 B2 * | 6/2005 | Tobiason | ................ | 250/237 R |
| 7,095,011 B2 * | 8/2006 | Kojima et al. | .......... | 250/231.13 |
| 7,098,446 B2 * | 8/2006 | Kojima | .................. | 250/231.14 |
| 7,126,696 B2 * | 10/2006 | Tobiason | .................... | 356/499 |
| 7,223,963 B2 * | 5/2007 | Okada et al. | ........... | 250/231.13 |
| 7,265,339 B1 * | 9/2007 | Ng et al. | ................ | 250/231.16 |
| 2007/0045525 A1 * | 3/2007 | Tsai et al. | .............. | 250/231.13 |
| 2009/0058349 A1 * | 3/2009 | Tsai et al. | .................... | 318/652 |

* cited by examiner

Primary Examiner—John R Lee
(74) Attorney, Agent, or Firm—Chun-Ming Shih (57) ABSTRACT

An angle-calculation apparatus for three-phase optical encoder receives three-phase sinusoidal signals 120 degree phase from the optical encoder and obtains angle information for a motor rotor. The angle-calculation apparatus includes an A/D converter, a digital signal processor (DSP), a phase digitalizer and a digital counter. The A/D converter converts three-phase analog signals of the optical encoder into three-phase digital signals. The phase digitalizer converts the three-phase analog signals into digital phase signals. The digital counter generates a counting value based on the digital phase signals. The DSP performs an inverse trigonometric function calculation on a relatively linear region of the three-phase digital signals to obtain the angle information. The DSP obtains the rotation turn number and rotation direction of the motor rotor according to the counting value.

14 Claims, 11 Drawing Sheets

Forward

FIG.9A

Reverse

ANGLE-CALCULATION APPARATUS AND ANGLE-CALCULATION METHOD FOR THREE-PHASE OPTICAL ENCODER

BACKGROUND OF THE INVENTION

1. Field of the Invention

The present invention relates to an angle-calculation apparatus and angle-calculation apparatus method for optical encode, especially to an angle-calculation apparatus and angle-calculation apparatus method for three-phase optical encoder.

2. Description of Prior Art

Figure 1:
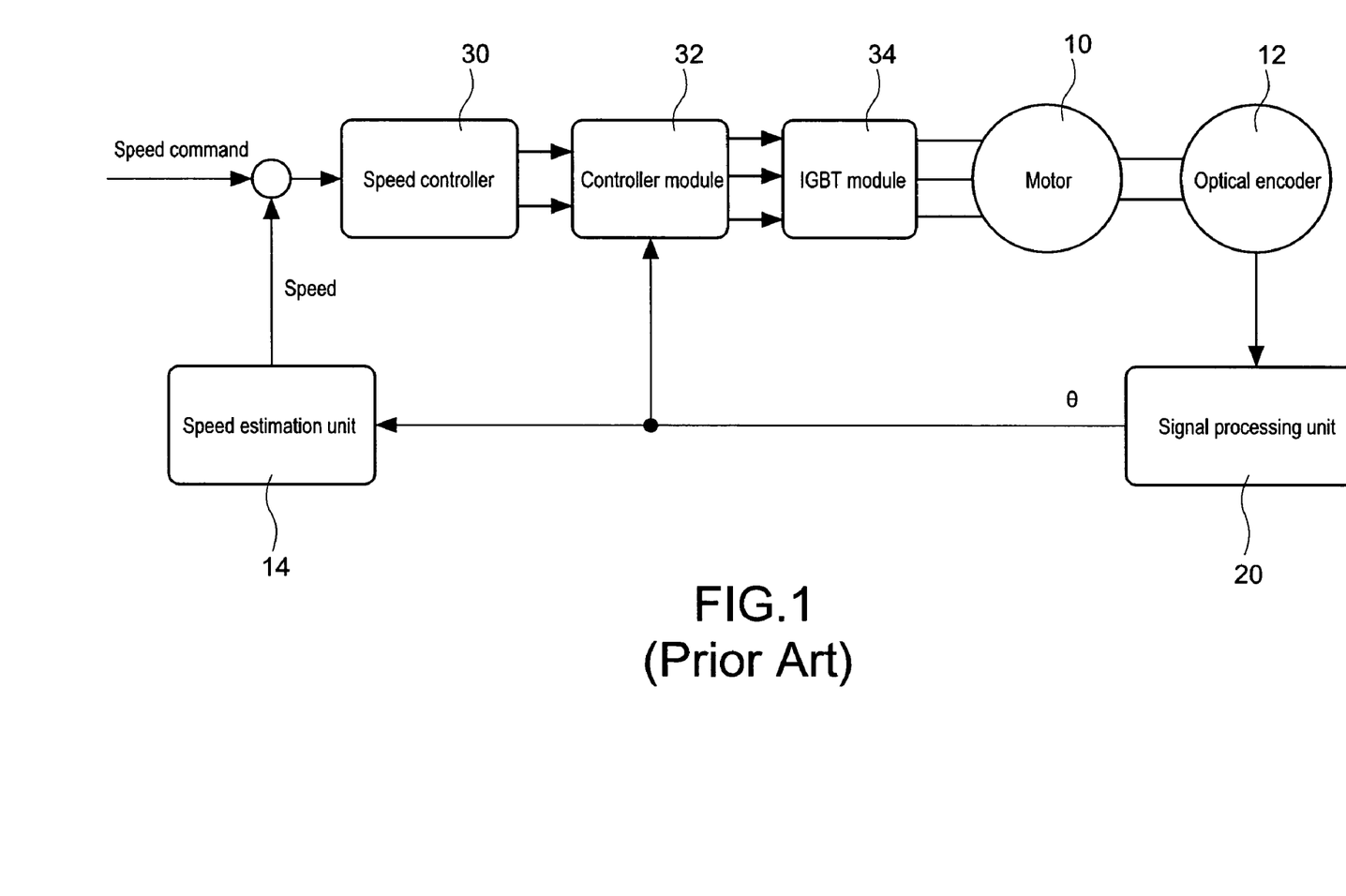
FIG. 1 shows the schematic diagram of a prior art AC servo motor.

The AC servomotor generally comprises an optical encoder wheel to sense angle information of a rotator, this angle information can be used to determine an electromagnetic field for driving stator current. Therefore, the speed of the AC servomotor can be precisely controlled FIG. 1 shows the schematic diagram of a prior art AC servo motor. The angular position of rotor in a motor 10 is detected by an optical encoder 12 and processed by a signal processing unit 20 to obtain angular information. The angular information is processed by a speed estimation unit 14 to obtain an estimated motor rotational speed. A speed controller 30 receives the estimated motor rotational speed and a speed command to control a controller module 32 and an IGBT module 34 in order to generate a motor speed control signal. The motor speed control signal can be used to precisely control the rotational speed of the motor 10.

The noise of the AC servomotor can be advantageously reduced if the optical encoder wheel can provide higher resolution. The conventional ways to enhance resolution for grating type optical encoder wheel includes: 1. Increasing the mark number on the optical encoder wheel. 2. Fine division by electronic skill. 3. Using different optical principle. The first method has limited effect because manufacture difficulty and diffraction phenomenon. The second method is more feasible because the mechanical structure does not need immense change. The third method needs to change the original architecture, such as using laser diode. Moreover, different optical design such as diffraction or interference are involved to enhance resolution.

The fine division for existing optical encoder includes following four types. 1. The fine division mechanism is incorporated into the optical encoder such as GPI 9220, DRC 25D, RSF MS 6X series. 2. Standalone product, such as RENISHAW RGE series, HEIDENHAIN EXE 605 and SONY MJ100/110, MJ500/600/700 Series Interpolation Module. 3. The fine division mechanism is integrated into controller card or other products such as MM1200-PC/104. 4. The fine division mechanism is integrated into motor such as Fanuc, Mitsubishi. The fine division skill can provide 4-2048 times enhancement or more, which depends on the quality of original signal and signal compensation skill.

The fine division method can be classified to phase fine division and amplitude fine division. The A, B output signals from an encoder are quasi-sinusoidal signal and can be expressed as:

$A = U_0 \sin \alpha$ $B = U_0 \cos \alpha$

U.S. Pat. No. 6,355,927 discloses an amplitude fine division method, wherein A, B output signals of different amplitudes are under subtraction operation and processed by logic gate to achieve fine division.

Figure 2:
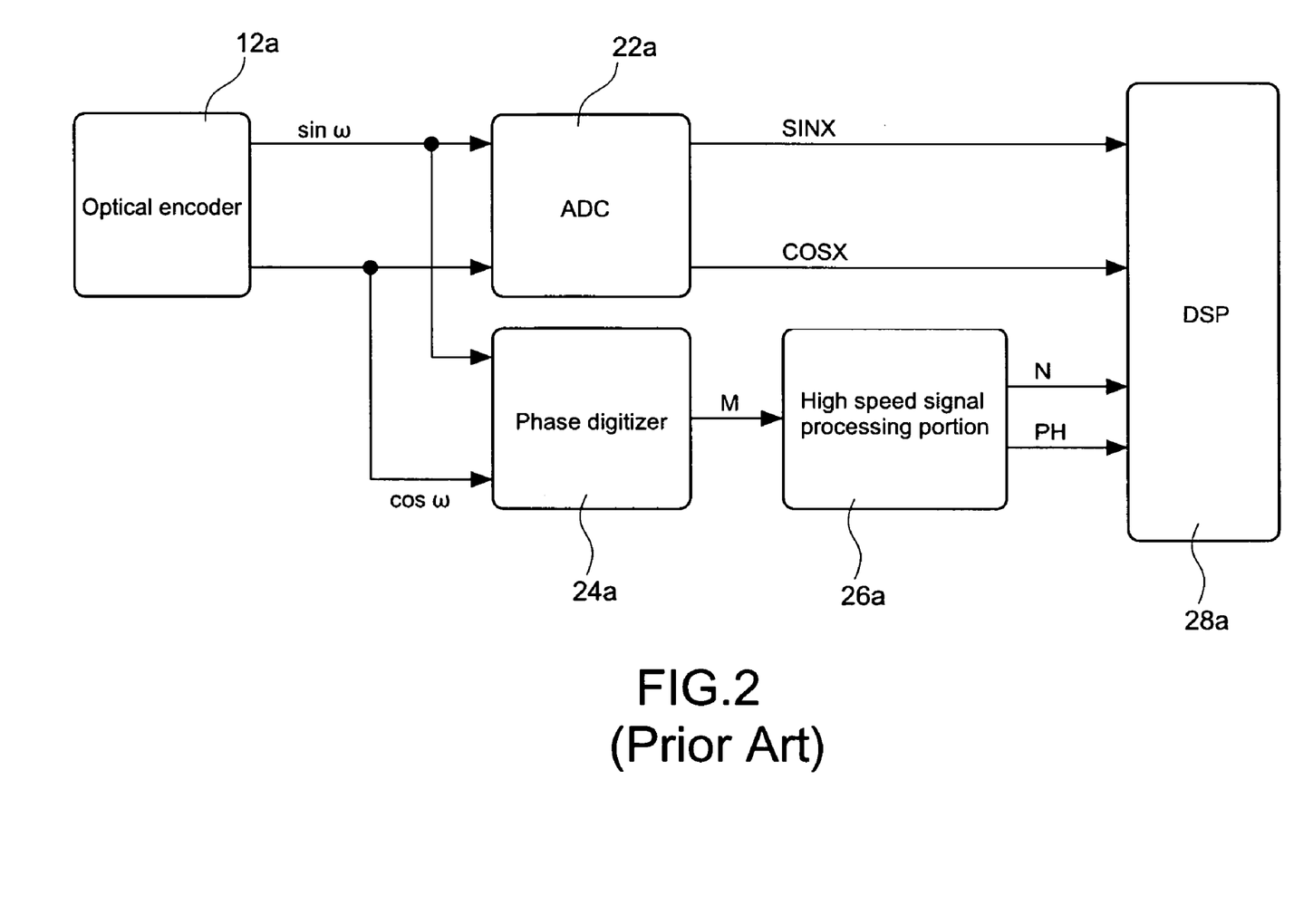
FIG. 2 shows block diagram for an implementation of electronic fine division.
Figure 3:
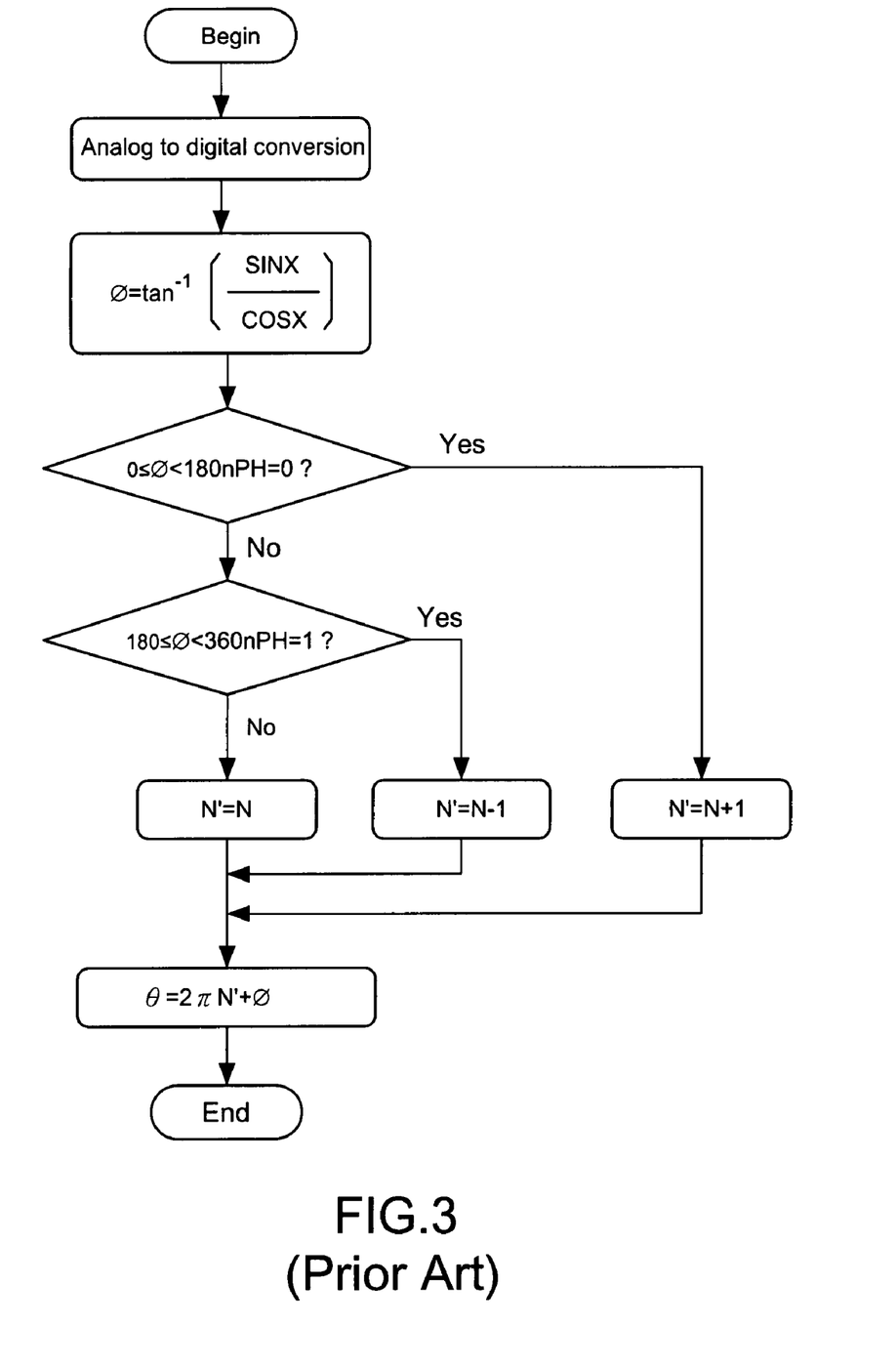
FIG. 3 shows flowchart for an implementation of electronic fine division.

As the speed of DSP and MPU is increased, the fine division scheme can be implemented by ADC with the help of DSP and MPU. The signals are actively or passively adjusted for higher resolution. FIGS. 2 and 3 show block diagram and flowchart for an implementation of electronic fine division. As shown in FIG. 2, the output angular information Sin ω and Cos ω of the encoder 12a are processed by an ADC 22a to convert into digital signals SIN X and COS X. The output angular information Sin ω and Cos ω of the encoder 12a are processed by a phase digitizer to obtain a digital signal M. The digital signal M is processed by the high speed signal processing portion 26a to generate a turn number signal N and a phase signal PH to provide quadrant and comparison information to the DSP 28a. With reference to FIG. 3, the DSP 28a determine the rotor angle θ according to the digital signals SIN X and COS X, the turn number signal N and the phase signal PH.

The etching technology for glass plate cannot satisfy the requirement of high resolution optical encoder. To obtain higher resolution, interpolation is performed to the quasi sinusoidal signals, which is produced by passing light through optical grating on the glass plate. In prior art angle-calculation method for motor rotor, sine signal and cosine signal (90 degree different to the sine signal) are used as source signals, and inverse function of tangent (Tan) or phase lock loop is used for angle calculation. However, full-amplitude portion is used for the sine signal and cosine signal. The source signals are required to be pure sinusoidal. The angle calculation is degraded when the source signals have harmonic component other than pure sinusoidal waves.

The sinusoidal signals with 90 degree difference are used to evaluate the impact of harmonics on interpolation angle:

$$A = U_0 \sin\theta + \frac{1}{8}\sin 3\theta + \frac{1}{32}\sin 5\theta + \frac{1}{128}\sin 7\theta$$

when $$B = U_0 \sin\left(\theta - \frac{\pi}{2}\right) + \frac{1}{8}\sin 3\left(\theta - \frac{\pi}{2}\right) + \frac{1}{32}\sin 5\left(\theta - \frac{\pi}{2}\right) + \frac{1}{128}\sin 7\left(\theta - \frac{\pi}{2}\right)$$

The interpolation angle θ calculated by the inverse function of tangent $$\theta = \tan^{-1}\frac{A}{B}$$

with fine division method shown in FIGS. 2 and 3 will have periodic error of ±2.5% because of harmonics. Therefore, the prior art angle-calculation method cannot achieve high resolution and has no robustness.

SUMMARY OF THE INVENTION

It is the object of the present invention to provide an angle-calculation apparatus and angle-calculation apparatus method for three-phase optical encoder with robustness and high resolution.

Accordingly, the present invention provides an angle-calculation apparatus for three-phase optical encoder, which receives three-phase sinusoidal signals 120 degree phase from the optical encoder and obtains angle information for a motor rotor. The angle-calculation apparatus includes an A/D converter, a digital signal processor (DSP), a phase digitalizer and a digital counter. The A/D converter converts three-phase analog signals of the optical encoder into three-phase digital signals. The phase digitalizer converts the three-phase analog signals into digital phase signals. The digital counter generates a counting value based on the digital phase signals. The DSP performs an inverse trigonometric function calculation on a relatively linear region of the three-phase digital signals to obtain the angle information. The DSP obtains the rotation turn number and rotation direction of the motor rotor according to the counting value. The relative linear region of the three-phase digital signal is a feasible region between the cross points of the three-phase digital signal to minimize the effect of non-ideal sinusoid signal.

BRIEF DESCRIPTION OF DRAWING

The features of the invention believed to be novel are set forth with particularity in the appended claims. The invention itself however may be best understood by reference to the following detailed description of the invention, which describes certain exemplary embodiments of the invention, taken in conjunction with the accompanying drawings in which:

DETAILED DESCRIPTION OF THE INVENTION

The present invention utilizes a principle different from prior art scheme, wherein in prior art scheme two phase signals, namely, sine and cosine signals, are used. In the present invention, three-phase signals with 120 degree phase difference are used to obtain the angle of rotor. The three-phase sinusoidal signals A, B and C in the present invention have following expressions:

$$A = U_0 \sin\theta$$
$$B = U_0 \sin\left(\theta - \frac{2\pi}{3}\right)$$
$$C = U_0 \sin\left(\theta - \frac{4\pi}{3}\right)$$

Figure 8A:
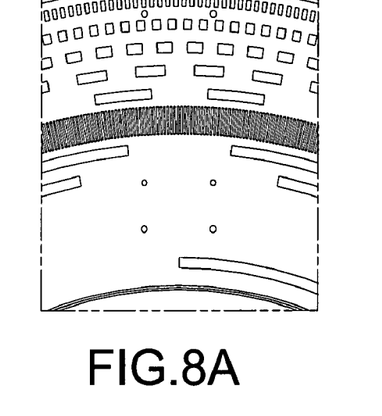
FIGS. 8A to 8C show the internal components in a three-phase optical encoder of the present invention.
Figure 8B:
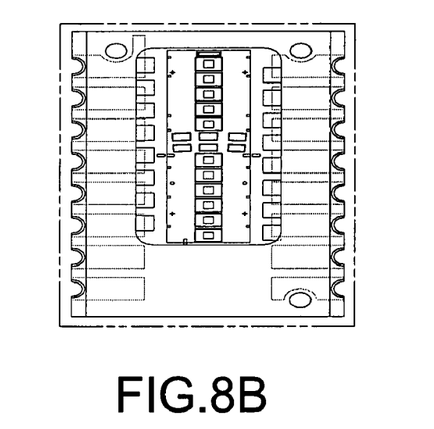
Figure 8C:
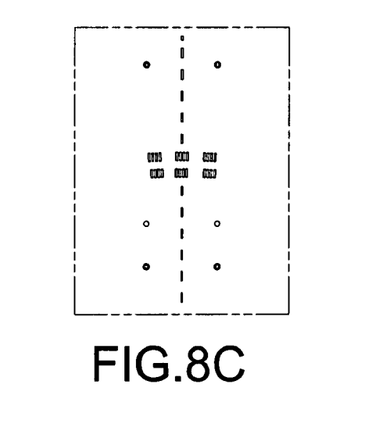

FIGS. 8A to 8C show the internal components in a three-phase encoder of the present invention. FIG. 8A shows the schematic view of the encoder wheel in the three-phase encoder of the present invention, which is similar to that in related art. FIG. 8B shows the photo diode in the three-phase encoder of the present invention, wherein three regions in middle section of the drawing represnet the light reception areas for the three-phase signals A, B and C in the present invention. FIG. 8C shows the photo mask for the three-phase encoder of the present invention, wherein three regions in the middle section are corresponding to masks for the three-phase signals A, B and C in the present invention. As can be seen from FIGS. 8A to 8C, the three-phase encoder composed of the encoder wheel, the mask and the photo diode can produce three-phase signals A, B and C with 120 degree phase difference therebetween.

Figure 5:
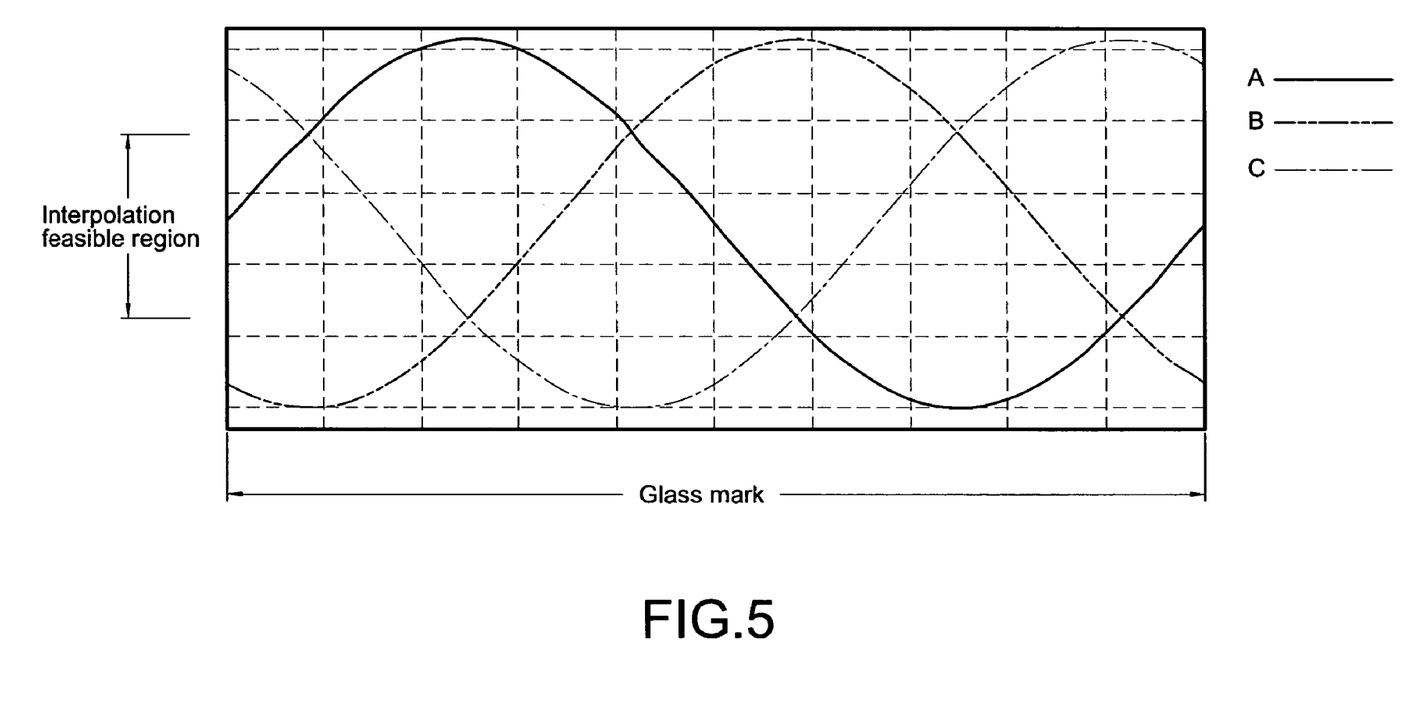
FIG. 5 shows the feasible region in the three-phase signals according to the present invention.

With reference to FIG. 5, the angle-calculation method of the present invention uses middle portion of the three-phase signals A, B and C for interpolation operation. The middle portion of the three-phase signals A, B and C has higher robustness for sinusoidal property. More particularly, the middle portion of the three-phase signals A, B and C can be preferably referred to as interpolation feasible region defined by the region between cross points of the three signals A, B and C. The interpolation feasible region is relatively linear and is not sensitive to the sinusoidal property of the curves, thus reducing interpolation error.

In the present invention, the offset and amplitude variation of the three signals A, B and C are assumed to be follows:

$$A = U_0\sin\theta + V_a$$
$$B = U_0\sin\left(\theta - \frac{2\pi}{3}\right) + V_b$$
$$C = U_0\sin\left(\theta - \frac{4\pi}{3}\right) + V_c$$

For simplicity, provided that $V_0=V_a=V_b=V_c$, the interpolation process for the three phases signal is stated below.

For instantaneous signals A, B and C, two variables $V_0$ and $U_0$ are defined as follows:

$$V_0 = (A+B+C)/3 \qquad (1)$$

$$U_0 = \sqrt{((A-V_0)^2+(B-V_0)^2+(C-V_0)^2)*2/3} \qquad (2)$$

Figure 6A:
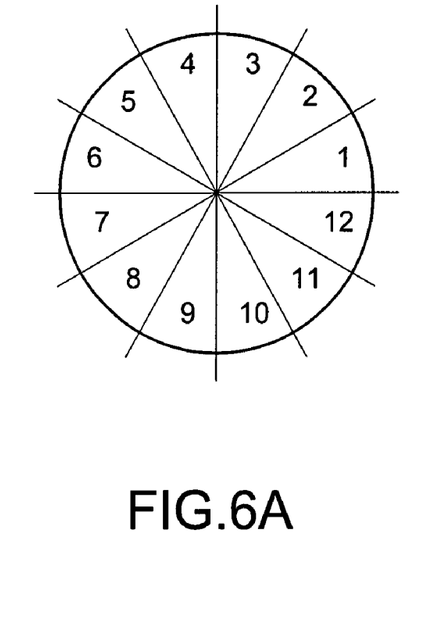
FIGS. 6A and 6B illustrate the 12 different sections of the feasible region.
Figure 6B:
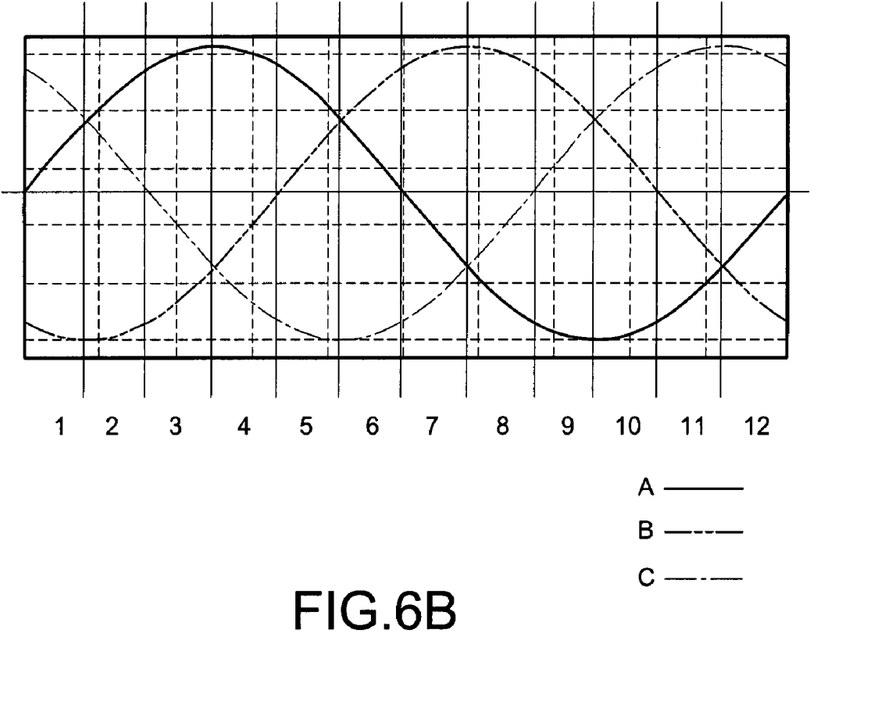
Figure 7:
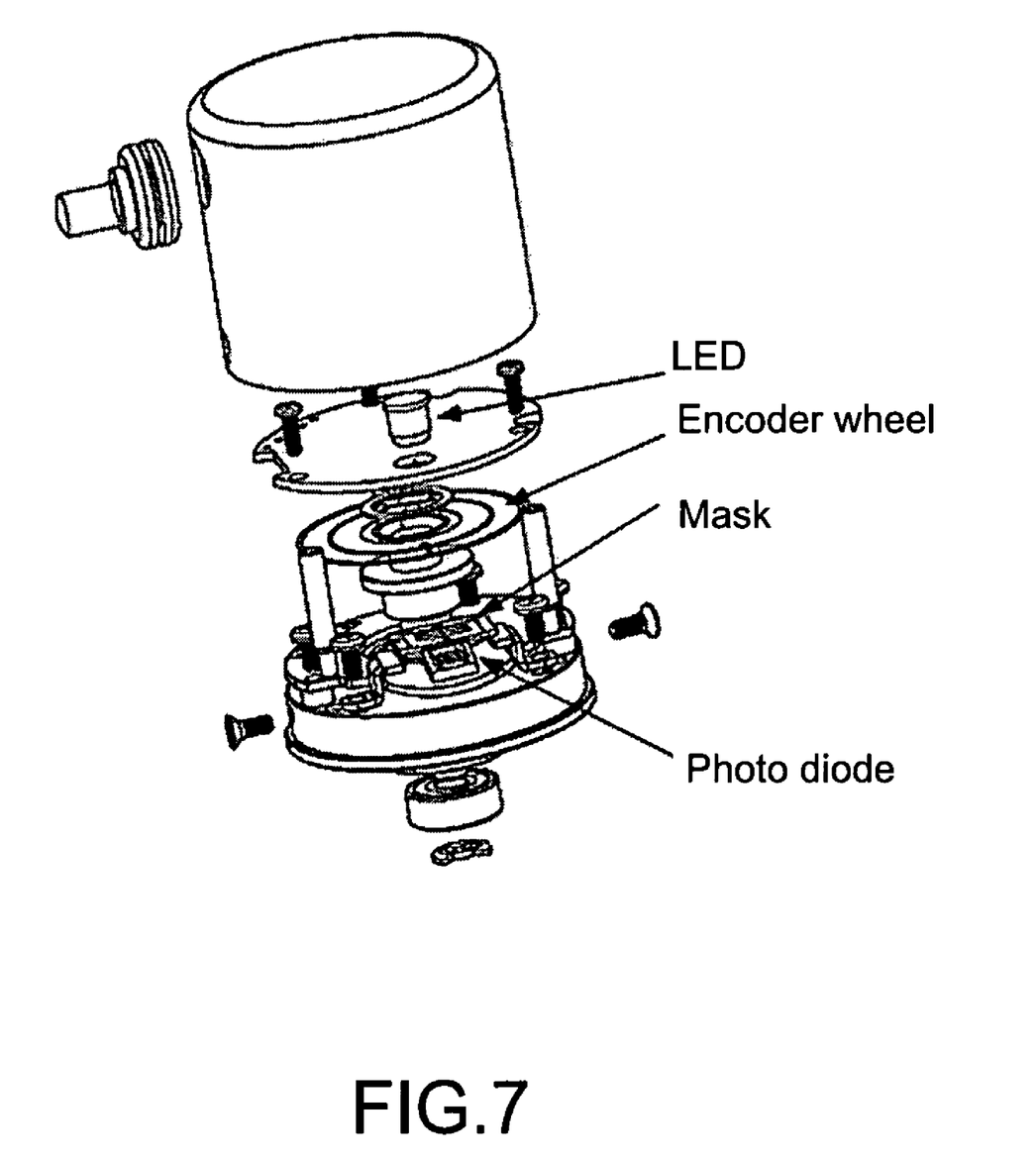
FIG. 7 is a perspective view of an optical encoder.

To exploit the relatively linear region for the three phases signals, the $2\pi$ period is divided into 12 regions according to the relative amplitudes among the three-phase signals A, B and C. Therefore, the relatively linear region for the three phase signals can be used, as shown in FIGS. 6A and 6B. The equation for determining angle $\theta$ for each region is shown below.

IF C>A>0, $$\theta = a\sin((A-V_0)/U_0) \qquad \text{(region 1)}$$

ELSEIF A>C>0, $$\theta = \pi/3 - a\sin((C-V_0)/U_0) \qquad \text{(region 2)}$$

ELSEIF B<C<0, $$\theta = \pi/3 + a\sin((V_0-C)/U_0) \qquad \text{(region 3)}$$

ELSEIF C<B<0, $$\theta = 2\pi/3 - a\sin((V_0-B)/U_0) \qquad \text{(region 4)}$$

ELSEIF A>B>0, $$\theta = 2\pi/3 + a\sin((B-V_0)/U_0) \qquad \text{(region 5)}$$

ELSEIF B>A>0, $$\theta = \pi - a\sin((A-V_0)/U_0) \qquad \text{(region 6)}$$

ELSEIF C<A<0,

θ=π+a sin((V₀−A)/U₀)  (region 7)

ELSEIF A<C<0,

θ=4π/3−a sin((V₀−C)/U₀)  (region 8)

ELSEIF B>C>0,

θ=4π/3+a sin((C−V₀)/U₀)  (region 9)

ELSEIF C>B>0,

θ=5π/3−a sin((B−V₀)/U₀)  (region 10)

ELSEIF A<B<0,

θ=5π/3+a sin((V₀−B)/U₀)  (region 11)

ELSEIF B<A<0,

θ=2π−a sin((V₀−A)/U₀)  (region 12)

In practial application, the inverse sine function (a sin) can be performed by lookup table. The instaneous sampling value of the three-phase signals A, B and C are used to calculate the average and the averaged offset for the three-phase signals A, B and C according to formulas (1) and (2). In prior art method, the amplitude change can be calculated by inverse tangent operation for sine and cosine signals. However, the offset for the sine and cosine signals cannot be calculated. In the present invention, the interpolation error is reduced even when the three-phase signals A, B and C have positive/negative offsets.

The impact of harmonics can also be evaluated for the angle-calculation apparatus of three-phase optical encoder according to the present invention with similar example before:

$$A = U_0 \sin\theta + \frac{1}{8}\sin 3\theta + \frac{1}{32}\sin 5\theta + \frac{1}{128}\sin 7\theta$$

$$B = U_0 \sin\left(\theta - \frac{2\pi}{3}\right) + \frac{1}{8}\sin 3\left(\theta - \frac{2\pi}{3}\right) + \frac{1}{32}\sin 5\left(\theta - \frac{2\pi}{3}\right) + \frac{1}{128}\sin 7\left(\theta - \frac{2\pi}{3}\right)$$

$$C = U_0 \sin\left(\theta - \frac{4\pi}{3}\right) + \frac{1}{8}\sin 3\left(\theta - \frac{4\pi}{3}\right) + \frac{1}{32}\sin 5\left(\theta - \frac{4\pi}{3}\right) + \frac{1}{128}\sin 7\left(\theta - \frac{4\pi}{3}\right)$$

The method of the present invention has periodic error of only ±0.6% due to harmonics, which has lower than harmonics error in prior art method.

The photo diode can generate 2500 sinusoidal signals (A, B and C signals) with 120 degree phase difference for a glass plate of 2500 marks per revolution. The 2500 sinusoidal signals are processed by hysteresis comparator and signal counter (hexagonal frequency) to produce 2500*6 pulses per revolution. The angle can be determined by lookup table. The synthetic resolution is 2700000 ppr when the table for θ=sin⁻¹ A has 90 segments in the angle range 0~$\pi/6$.

Figure 4:
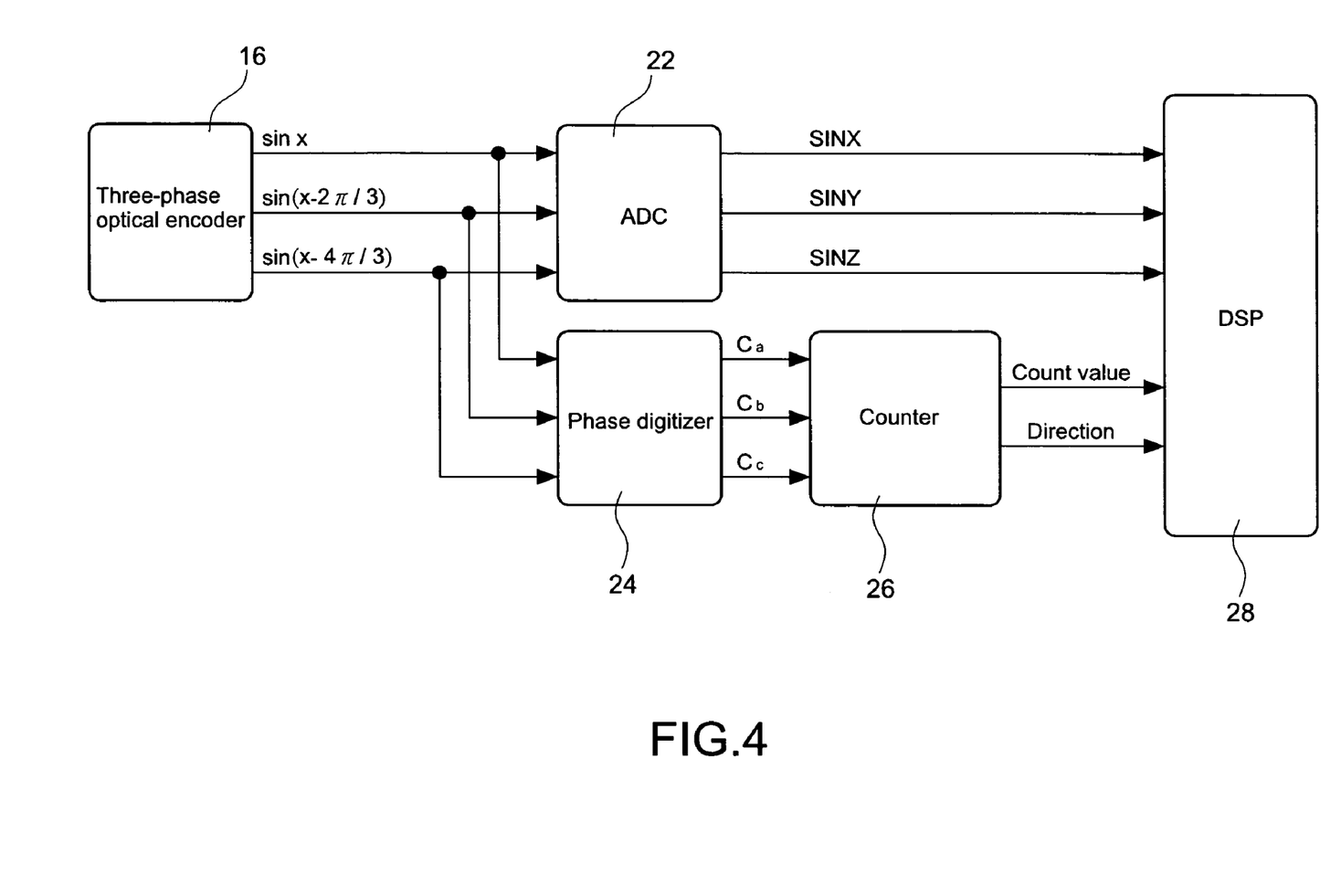
FIG. 4 shows the block diagram for the angle-calculation apparatus for three-phase optical encoder according to the present invention.

FIG. 4 shows the block diagram for the angle-calculation apparatus 20 for three-phase optical encoder 16 according to the present invention. The angle-calculation apparatus 20 receives the three-phase signals A, B and C from the optical encoder 12 and obtains a rotation angle signal. The angle-calculation apparatus 20 comprises an analog-to-digital converter (ADC) 22 to convert the three analog angle signals A, B and C (namely, sin (x), sin (x−2p/3), sin(x−4p/3)) into three digital signals SIN X, SIN Y and SIN Z. The angle-calculation apparatus 20 further comprises a phase digitizer 24 and a digital counter 26 to obtain a count value signal N based on the three analog angle signals A, B and C (namely, sin (x), sin (x−2p/3), sin(x−4p/3)). The three digital signals SIN X, SIN Y and SIN Z and the count value signal N are processed by a digital signal processor (DSP) 28 to obtain a rotation angle for the motor rotor.

The above-mentioned count value signal N can be generated by following way.

Figure 9A:
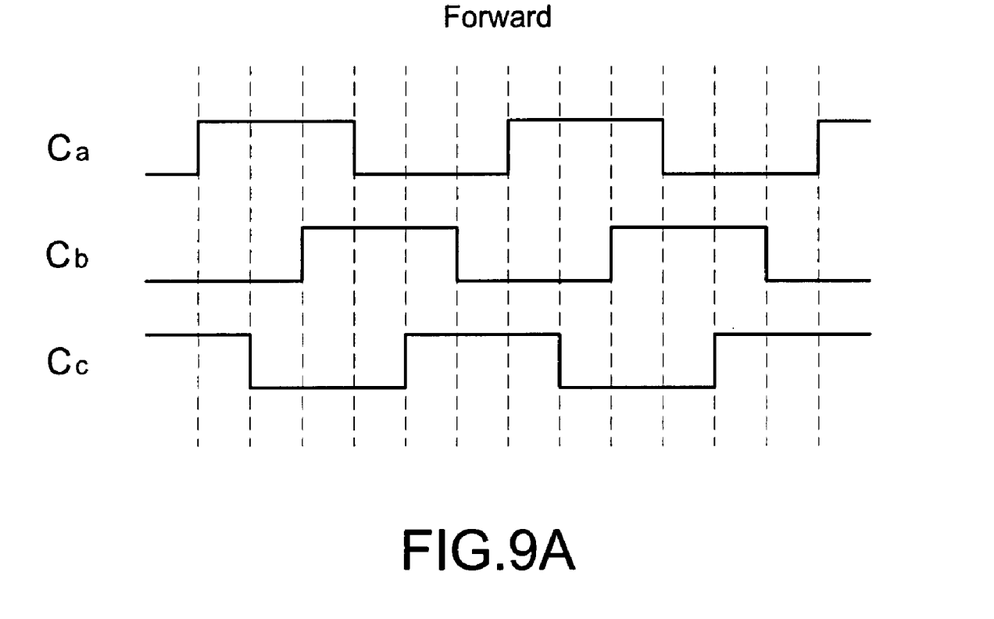
FIGS. 9A and 9B show the output result of phase digitizer in forward and reverse directions.
Figure 9B:
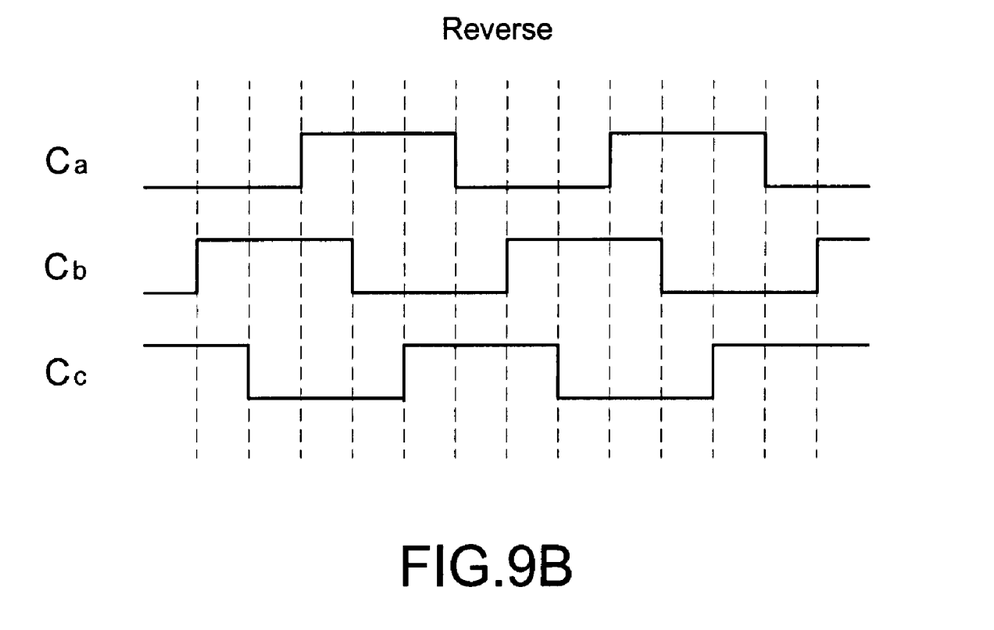
Figure 10A:
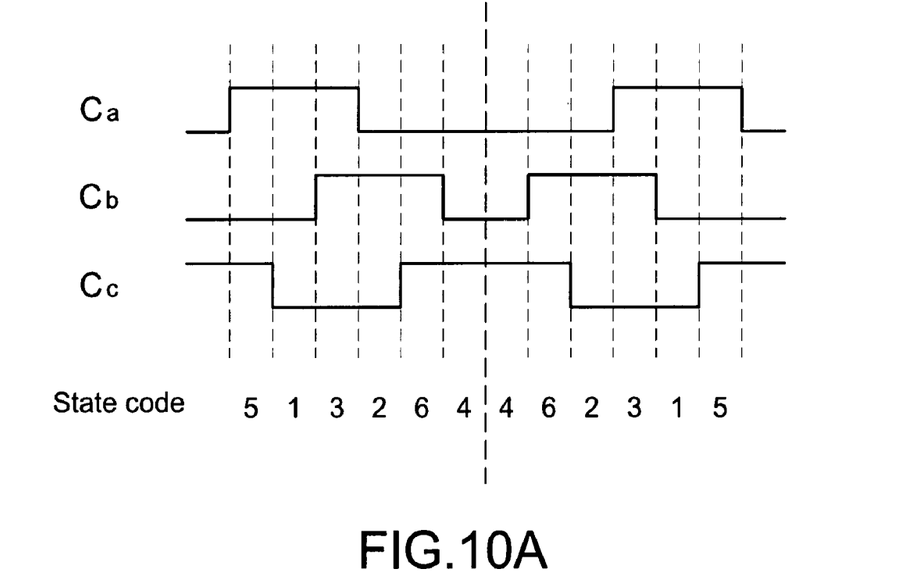
FIGS. 10A and 10B demonstrate the counting by a state machine.
Figure 10B:
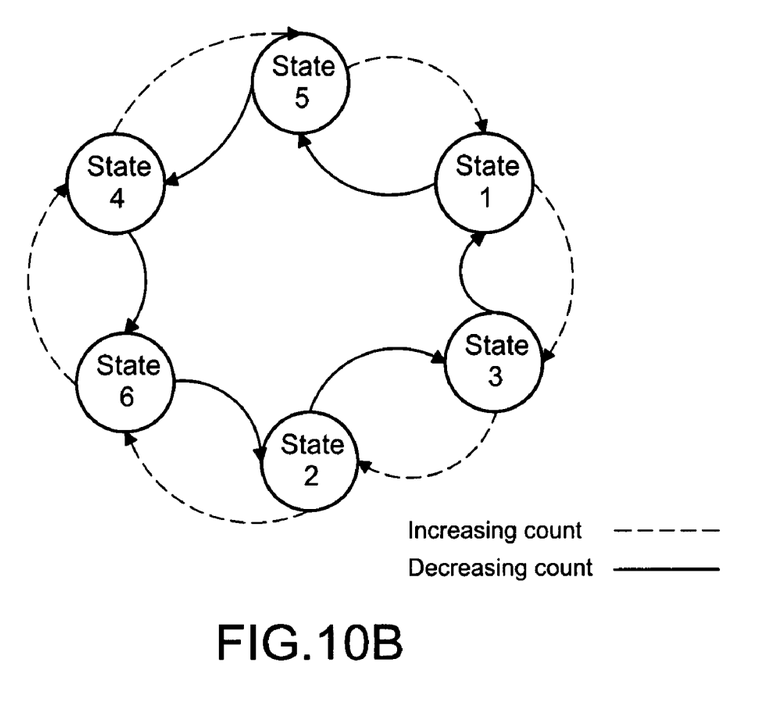

The three-phase signals A, B and C have 120 degree phase difference and the phase digitizer 24 processes the three-phase signals A, B and C to obtain pulse signals (digital phase signals) Ca, Cb and Cc in forward direction and reverse direction, as shown in FIGS. 9A and 9B. The digital counter can be implemented by a state machine as shown in FIGS. 10A and 10B. There are six different combinations for the pulse signals Ca, Cb and Cc. The six different combinations are used as binary coding and the counting for the three-phase signals can be determined with reference to the current state of the state machine.

With reference to FIG. 10A, the status coding of the state machine is as below:

When Ca is of high level, Cb is of low level and Cc is of low level, the coding status is corresponding to State 1.

When Ca is of low level, Cb is of high level and Cc is of low level, the coding status is corresponding to State 2.

When Ca is of high level, Cb is of high level and Cc is of low level, the coding status is corresponding to State 3.

When Ca is of low level, Cb is of low level and Cc is of high level, the coding status is corresponding to State 4.

When Ca is of high level, Cb is of low level and Cc is of high level, the coding status is corresponding to State 5.

When Ca is of low level, Cb is of high level and Cc is of high level, the coding status is corresponding to State 6.

With reference to FIG. 10B, the state machine has following operation:

The first example is that the current status of the state machine is State 5 (when Ca is of high level, Cb is of low level and Cc is of high level) and the encoder is moved in a forward direction. When the state machine detects that the input will change its state to State 1 (when Ca is of high level, Cb is of low level and Cc is of low level), the count value of the counter is added by one and the coding status of the state machine is changed to State 1 from State 5.

The second example is that the current status of the state machine is State 5 (when Ca is of high level, Cb is of low level and Cc is of high level) and the encoder is moved in a reverse direction. When the state machine detects that the input will change its state to State 4 (when Ca is of low level, Cb is of low level and Cc is of high level), the count value of the counter is decreased by one and the coding status of the state machine is changed to State 4 from State 5.

The third example is that the current status of the state machine is State 5 (when Ca is of high level, Cb is of low level and Cc is of high level). When the state machine detects that the input is neither State 1 nor State 4, the state machine judges that an interference signal is present. Therefore, the count value of the counter is not changed and the state machine stays in original status.

Figure 11:
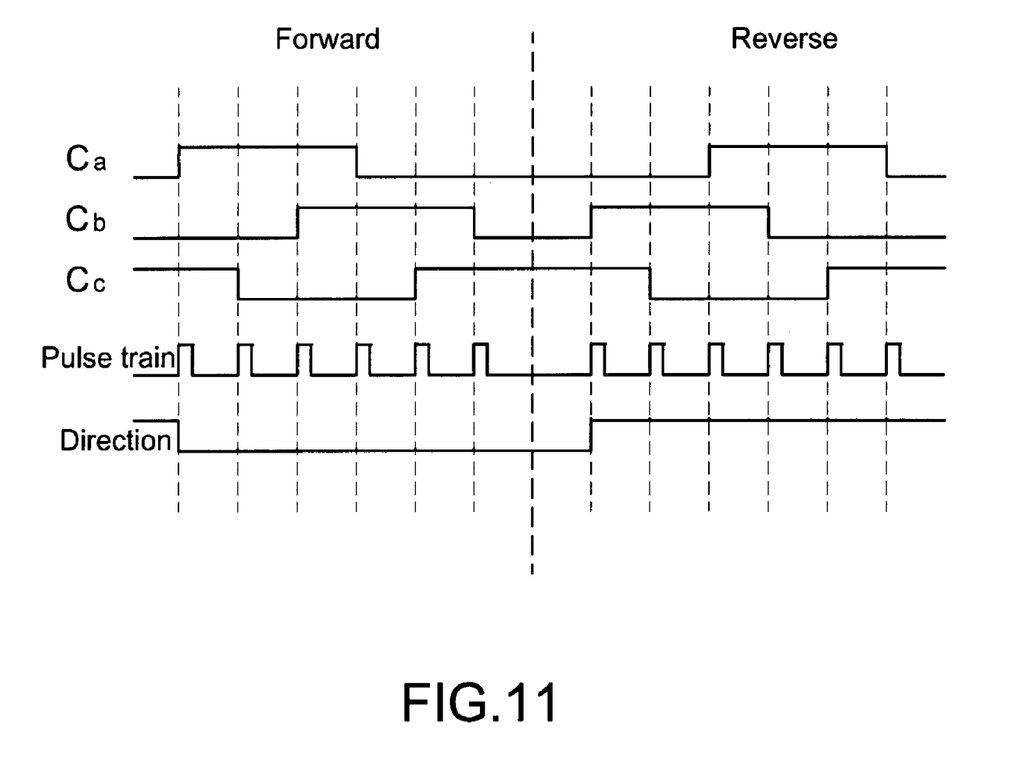
FIG. 11 demonstrates another counting scheme.

FIG. 11 shows another way for counting the three-phase signals A, B and C. The counted signals Ca, Cb and Cc are processed to generate a short-pulse train signal and a direction signal. When the encoder operates, a short pulse is generated to indicate that at least one of the counted signals Ca, Cb and Cc has changed.

When the pulse signals Ca, Cb and Cc manifests a forward rotation, the direction signal is reset to low level. When the pulse signals Ca, Cb and Cc manifests a reverse rotation, the direction signal is set to high level. Therefore, the counter can generate count value with increasing value and decreasing value by the short-pulse train signal and the direction signals.

The advantages of the present invention can be summarized as follows:
1. The method has robustness for non-ideal sinusoidal wave.
2. The method has better linearity for interpolation and lower interpolation error.
3. The method can provide higher resolution.

Although the present invention has been described with reference to the preferred embodiment thereof, it will be understood that the invention is not limited to the details thereof. Various substitutions and modifications have suggested in the foregoing description, and other will occur to those of ordinary skill in the art. Therefore, all such substitutions and modifications are intended to be embraced within the scope of the invention as defined in the appended claims.

What is claimed is:

1. An angle-calculation apparatus for a three-phase optical encoder, the three-phase optical encoder generating three-phase analog sinusoidal signal with 120 degree phase difference according to a rotation of a motor rotor, the angle-calculation apparatus comprising:
  an analog to digital converter (A/D converter) adapted to convert three-phase analog signals from the three-phase optical encoder into three-phase digital signals; and
  a digital signal processor (DSP) adapted to receive the three-phase digital signals and to perform an inverse trigonometric function calculation on a relatively linear region of the three-phase digital signals to obtain a rotation angle for the motor rotor.

2. The angle-calculation apparatus in claim 1, wherein the angle-calculation apparatus further comprises:
  a phase digitalizer converting the three-phase analog signals into digital phase signals; and
  a digital counter processing the digital phase signals to generate a count value,
  wherein the DSP is adapted to calculate a rotation direction of the motor rotor by the count value.

3. The angle-calculation apparatus in claim 1, wherein the relatively linear region of the three-phase digital signals is defined by cross points of the three-phase digital signals.

4. The angle-calculation apparatus in claim 2, wherein the digital counter is implemented by a state machine.

5. The angle-calculation apparatus in claim 1, wherein the three-phase digital signal are indicated as A, B, C, and the DSP judges the rotation angle θ for the motor rotor by following formula:
  IF C>A>0,
  $\theta = a\sin((A-V_0)/U_0)$
  ELSEIF A>C>0,
  $\theta = \pi/3 - a\sin((C-V_0)/U_0)$
  ELSEIF B<C<0,
  $\theta = \pi/3 + a\sin((V_0-C)/U_0)$
  ELSEIF C<B<0,
  $\theta = 2\pi/3 - a\sin((V_0-B)/U_0)$
  ELSEIF A>B>0,
  $\theta = 2\pi/3 + a\sin((B-V_0)/U_0)$
  ELSEIF B>A>0,
  $\theta = \pi - a\sin((A-V_0)/U_0)$
  ELSEIF C<A<0,
  $\theta = \pi + a\sin((V_0-A)/U_0)$
  ELSEIF A<C<0,
  $\theta = 4\pi/3 - a\sin((V_0-C)/U_0)$
  ELSEIF B>C>0,
  $\theta = 4\pi/3 + a\sin((C-V_0)/U_0)$
  ELSEIF C>B>0,
  $\theta = 5\pi/3 - a\sin((B-V_0)/U_0)$
  ELSEIF A<B<0,
  $\theta = 5\pi/3 + a\sin((V_0-B)/U_0)$
  ELSEIF B<A<0,
  $\theta = 2\pi - a\sin((V_0-A)/U_0)$
wherein
  $V_0 = (A+B+C)/3$
  $U_0 = \sqrt{((A-V_0)^2 + (B-V_0)^2 + (C-V_0)^2)*2/3}$.

6. A method for calculating a rotation angle for a motor rotor based on three-phase analog signals from a three-phase optical encoder, comprising:
  analog-to-digital converting the three-phase analog signals into three-phase digital signals; and
  performing an inverse trigonometric function calculation on a relatively linear region of the three-phase digital signals to obtain the rotation angle for the motor rotor.

7. The method as in claim 6, further comprising:
  converting the three-phase analog signals into digital phase signals;
  counting the digital phase signals to generate a count value; and
  determining a rotation direction for the motor rotor by the count value.

8. The method as in claim 6, wherein the relatively linear region of the three-phase digital signals is defined by cross points of the three-phase digital signals.

9. The method as in claim 6, wherein the three-phases digital signal are indicated as A, B, C, and the rotation angle θ for the motor rotor is judged by following formula:
  IF C>A>0,
  $\theta = a\sin((A-V_0)/U_0)$
  ELSEIF A>C>0,
  $\theta = \pi/3 - a\sin((C-V_0)/U_0)$
  ELSEIF B<C<0,
  $\theta = \pi/3 + a\sin((V_0-C)/U_0)$
  ELSEIF C<B<0,
  $\theta = 2\pi/3 - a\sin((V_0-B)/U_0)$
  ELSEIF A>B>0,
  $\theta = 2\pi/3 + a\sin((B-V_0)/U_0)$
  ELSEIF B>A>0,
  $\theta = \pi - a\sin((A-V_0)/U_0)$
  ELSEIF C<A<0,
  $\theta = \pi + a\sin((V_0-A)/U_0)$
  ELSEIF A<C<0,
  $\theta = 4\pi/3 - a\sin((V_0-C)/U_0)$
  ELSEIF B>C>0,
  $\theta = 4\pi/3 + a\sin((C-V_0)/U_0)$
  ELSEIF C>B>0,
  $\theta = 5\pi/3 - a\sin((B-V_0)/U_0)$

ELSEIF A<B<0, $$\theta = 5\pi/3 + a\sin((V_0-B)/U_0)$$

ELSEIF B<A<0, $$\theta = 2\pi - a\sin((V_0-A)/U_0)$$

wherein $$V_0 = (A+B+C)/3$$

$$U_0 = \sqrt{((A-V_0)^2 + (B-V_0)^2 + (C-V_0)^2)*2/3}.$$

10. An angle-calculation system for a motor rotor, comprising:
   an optical encoder generating three-phase analog sinusoidal signals with 120 degree phase difference based on a rotation of the motor rotor; and
   an angle-calculation apparatus adapted to receive the three-phase analog signals and calculate a rotation angle of the motor rotor based on the three-phase analog signals.

11. The angle-calculation system in claim 10, wherein the angle-calculation apparatus further comprises:
   an analog to digital converter (A/D converter) converting three-phase analog signals from the optical encoder into three-phase digital signals; and
   a digital signal processor (DSP) adapted to receive the three-phase digital signals and to perform an inverse trigonometric function calculation on a relatively linear region of the three-phase digital signals to obtain the rotation angle for the motor rotor.

12. The angle-calculation system in claim 11, further comprising:
   a phase digitalizer converting the three-phase analog signals into digital phase signals; and
   a digital counter processing the digital phase signals to generate a count value;
   wherein the DSP is adapted to calculate a turn direction of the motor rotor by the count value.

13. The angle-calculation system in claim 11, wherein the relatively linear region of the three-phase digital signals is defined by cross points of the three-phase digital signals.

14. The angle-calculation system in claim 12, wherein the digital counter is implemented by a state machine.

* * * * *